United States Patent [19]
Heyl et al.

[11] Patent Number: 5,398,003
[45] Date of Patent: Mar. 14, 1995

[54] PULSE WIDTH MODULATION SPEAKER AMPLIFIER

[75] Inventors: Lawrence F. Heyl, Mountain View; Steven E. Austin, San Jose, both of Calif.

[73] Assignee: Apple Computer, Inc., Cupertino, Calif.

[21] Appl. No.: 219,956

[22] Filed: Mar. 30, 1994

[51] Int. Cl.$^6$ .............................................. H03F 3/38
[52] U.S. Cl. ....................................... 330/10; 330/251
[58] Field of Search ................... 330/10, 146, 207 A, 330/251

[56] References Cited

U.S. PATENT DOCUMENTS

| | | | |
|---|---|---|---|
| 4,489,222 | 12/1984 | Lusignan | 330/10 X |
| 4,773,096 | 9/1988 | Kirn | 330/10 X |
| 5,077,539 | 12/1991 | Howatt | 330/251 X |

*Primary Examiner*—James B. Mullins
*Attorney, Agent, or Firm*—Blakely, Sokoloff, Taylor & Zafman

[57] ABSTRACT

An open-loop speaker amplifier and a dynamic range reduction circuit are disclosed. The speaker amplifier includes a bridge driver and a bridge circuit. The bridge circuit includes a first set of switches and a second set of switches. When the first set of switches are activated, a positive current flows through a speaker load. When the second set of switches are activated, a negative current flows through the speaker load. The bridge driver generates a pulse width modulated signal and a delayed pulse width modulated signal to drive the first and second set of switches of the bridge circuit responsive to a modulation signal. The modulation signal may be, for example, a plurality of pulse code modulated samples representing sound. The dynamic range reduction circuit modifies a selected signal to reduce the dynamic range of the sound reproduced based on the modulation signal. The selected signal is either the modulation signal or a reference signal. In one embodiment, the dynamic range reduction circuit modifies the selected signal by processing the selected signal based on a smooth saturating function. In another embodiment, the dynamic range reduction circuit modifies the amplitude of the reference signal based on an envelope size of the modulation signal.

19 Claims, 8 Drawing Sheets

PRIOR ART

PULSE WIDTH MODULATION SPEAKER AMPLIFIER

BACKGROUND OF THE INVENTION

Personal computers typically have an integral loudspeaker for reproduction of sound. Depending on the type of computer (desk-top, portable, personal assistant), the types of sound output required and the sound volume needed will change. Different software will also have different dynamic range requirements. Commonly encountered output sounds include a power-on "boot-beep", alert sounds, voice annotation, and multimedia content. Prior art loudspeaker amplifier designs typically use linear analog amplifier circuitry to drive loudspeakers. Such amplifier designs may include bridge-tied outputs which allow single supply voltage operation.

Various alternative amplifier designs have been developed to achieve the same effect as linear analog amplifiers. For example, loudspeaker amplifiers have been developed which employ a switched mode operation. In switched mode operation, the frequency, duty ratio, or both is controlled to achieve the same average current through the loudspeaker as would be achieved by using a linear analog amplifier. A typical switch mode amplifier is shown in FIG. 1.

Figure 1:
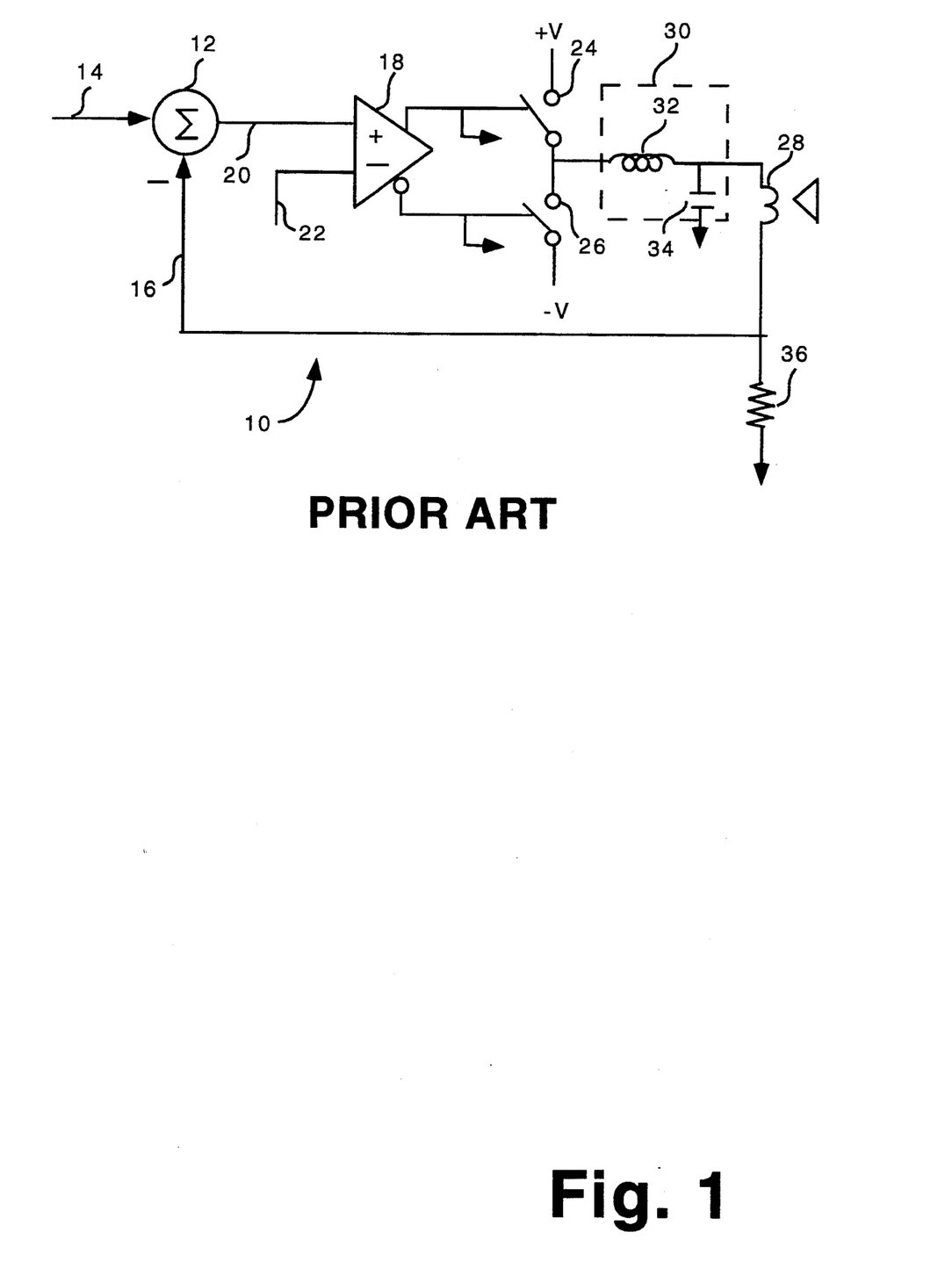
FIG. 1 is a schematic diagram of a prior art, closed-loop, analog amplifier.

Referring to FIG. 1, a typical switch mode amplifier 10 includes a circuit 12 for combining an analog sound signal on a first line 14 with a feedback signal on a second line 16. The adjusted sound signal is transmitted to a comparator 18 over a line 20.

Comparator 18 compares the adjusted sound signal to a reference signal received over a line 22. If the amplitude of the adjusted sound signal exceeds the amplitude of the reference signal, the comparator 18 generates a first signal to close a first switch 24, and a second signal to open a second switch 26. If the amplitude of the adjusted sound signal falls below the amplitude of the reference signal, the comparator 18 generates a second signal to open the first switch 24, and the second signal to close the second switch 26.

One side of a speaker load 28 is connected to switches 24 and 26 through a filter circuit 30. Filter circuit 30 consists of an inductor 32 and a capacitor 34. The other side of the speaker load 28 is connected to ground through a resistor 36 and to circuit 12 by line 16. Sound is generated as current flows through speaker load 28 as switches 24 and 26 open and close in response to the signals from comparator 18.

Amplifier 10 is closed-looped. That is, the sound output of speaker load 28 is adjusted responsive to a feedback signal. Since speaker loads typically do not have a constant impedance over bandwidth, feedback signals are used to adjust the sound signal to better linearize the sound output.

Unfortunately, the manufacture of closed-loop amplifiers designed as shown in FIG. 1 is relatively expensive. For internal computer loudspeaker applications, the expense associated with such closed-loop amplifiers is often unjustified, since such applications often do not require the sound quality of other, high-fidelity applications. Another disadvantage of analog amplifiers is the difficulty in compensating for the tolerance deviations in analog components. In light of the foregoing, it is clearly desirable to provide a simpler, less expensive amplifier. Further, it is clearly desirable to provide an amplifier based on digital technology.

Applying specific enhancement techniques to the general problem of loudspeaker amplifier design is difficult because different applications have different sound requirements. For example, some sounds should be played to alert the user independently of ambient noise. Other sounds could be enhanced to increase intelligibility. Intelligibility may be increased, for example, by increasing the gain for otherwise soft sounds, and decreasing the gain for otherwise loud sounds. Other sounds should not be modified in any fashion, but reproduced exactly. Therefore, it is clearly desirable to provide an amplifier which allows a user to change the response of the amplifier to enhance the "presence" or intelligibility of the sound data, but is equally capable of playing the sound back exactly as originally recorded.

SUMMARY OF THE INVENTION

According to one aspect of the invention, an open-loop amplifier for driving a loud speaker is provided. The amplifier generally includes a plurality of switches, including a first set of switches and a second set of switches. The first set of switches is connected to the loud speaker and to a power source. The first set of switches is configured such that, when enabled, a positive current flows through the loud speaker. The second set of switches is configured such that, when enabled, a negative current flows through the loud speaker.

The amplifier further includes a bridge driver connected with the plurality of switches. The bridge driver receives a plurality of pulse code modulated samples which represent sound sampled at a specified sampling rate, and activates and deactivates the plurality of switches in response to the plurality of pulse code modulated samples.

The bridge driver generally includes a pulse width modulation generation unit and a delay or break-before-make unit. The pulse width modulation generation unit is configured to receive a square wave signal and the plurality of pulse code modulated samples. The pulse width modulation generation unit generates a pulse width modulated signal based on the square wave signal and the plurality of pulse code modulated samples. The delay unit is connected with the pulse width modulation generation unit, and receives the pulse width modulated signal from the pulse width modulation generation unit. The delay unit generates a delayed pulse width modulated signal, which is the pulse width modulated signal with a predetermined delay.

The first set of switches are activated and deactivated based upon the pulse width modulated signal, and the second set of switches are activated and deactivated based upon the delayed pulse width modulated signal.

According to one embodiment of the invention, the pulse width modulation generation unit generally includes a programmable counter, a comparator, a modulator signal generator, and a latch. The programmable counter receives the pulse code modulated samples and stores the most recently received pulse code modulated sample. The programmable counter decrements the most recently received pulse code modulated sample in response to a pulse width modulation clock signal.

The comparator is connected to the programmable counter, and compares the most recently received pulse code modulated sample to a predetermined value. When the most recently received pulse code modulated sample falls below the predetermined value, the comparator generates an indicator signal. The modulator signal generator is connected to the comparator, and receives the indicator signal from the comparator. The modulator signal generator also receives the square wave signal. The modulator signal generator generates a modulator signal, which is the square wave signal delayed for a duration responsive to the indicator signal.

The latch has a clear input, a preset input, and an output. The clear input is connected to the modulator signal generator for receiving the modulator signal, and the preset input is configured to receive the square wave signal. The latch generates the pulse width modulated signal at its output in response to the modulator signal and the square wave signal.

According to another aspect of the invention, the amplifier includes a digital-to-analog converter and a plurality of comparators. The digital-to-analog converter receives a plurality of sound samples and converts the plurality of sound samples to an analog sound signal. The plurality of comparators compare the analog sound signal to a reference signal. The bridge driver activates and deactivates the plurality of switches in response to the comparison.

BRIEF DESCRIPTION OF THE DRAWINGS

The invention may best be understood by referring to the following description and accompanying drawings which illustrate the invention. In the drawings.

DETAILED DESCRIPTION OF THE PREFERRED EMBODIMENT

Figure 2:
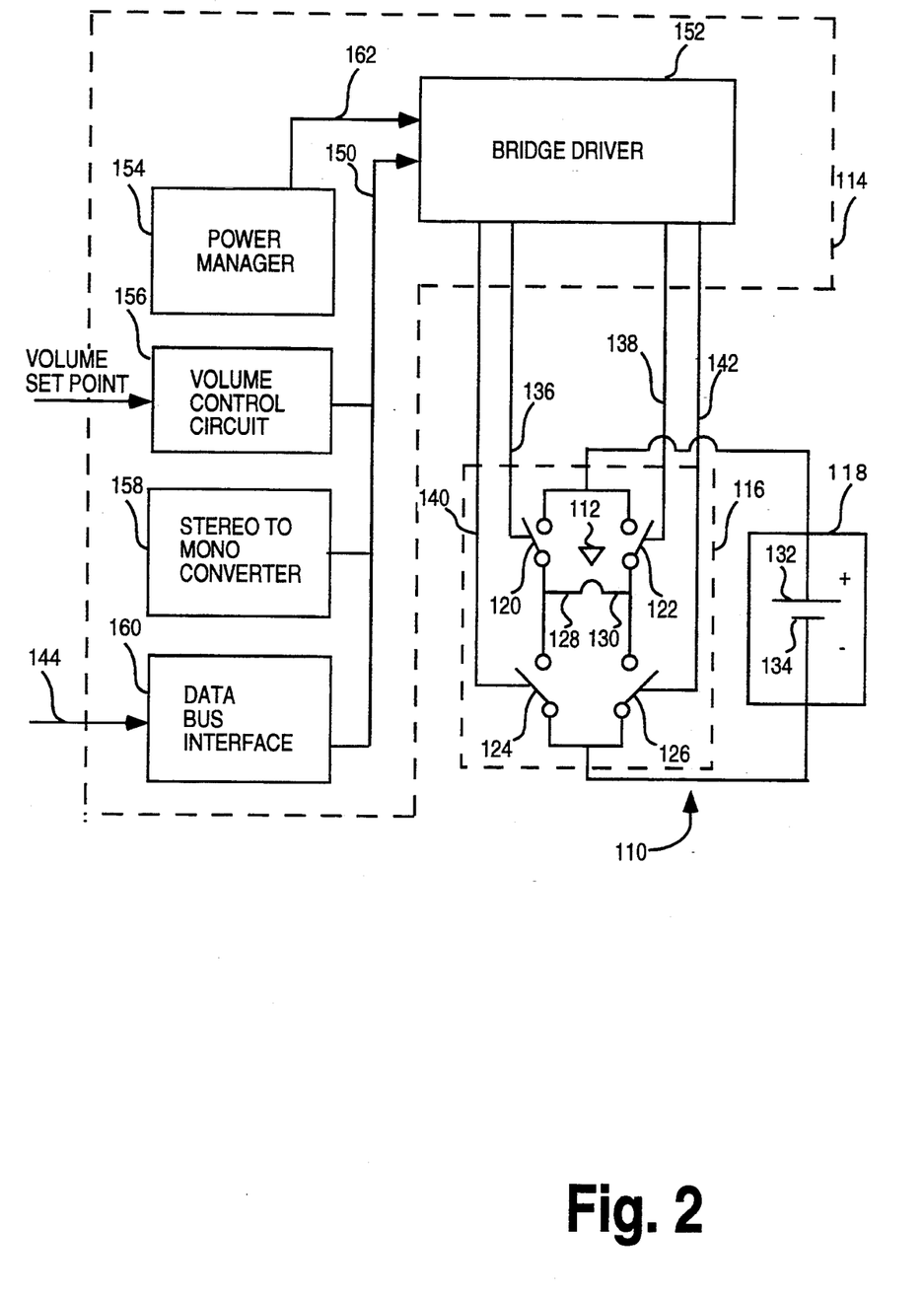
FIG. 2 is a schematic diagram of a speaker system including a digital, open-loop amplifier according to one embodiment of the present invention.

Referring to FIG. 2, it illustrates a schematic diagram of a speaker system 110 according to one embodiment of the invention. Speaker system 110 generally includes a speaker load 112, a speaker controller 114, a bridge circuit 116 and a power source 118.

Bridge circuit 116 generally includes four switches 120, 122, 124 and 126. Switches 120, 122, 124 and 126 may be, for example, field effect transistors or bipolar transistors. Switch 120 is disposed between a first side 128 of speaker load 112 and a positive terminal 132 of power source 118. Switch 122 is disposed between a second side 130 of speaker load 112 and the positive terminal 132. Switch 124 is disposed between the first side 128 of speaker load 112 and a negative terminal 134 of power supply 118. Switch 126 is disposed between the second side 130 of speaker load 112 and the negative terminal 134. Switches 120, 122, 124 and 126 are controlled by signals generated by controller 114 over a plurality of control lines 136, 138, 140 and 142, respectively.

Thus configured, switches 120 and 126 comprise a first diagonal pair, and switches 122 and 124 comprise a second diagonal pair. When the first diagonal pair are closed and the second diagonal pair are open, current flows from the first side 128 of speaker load 112 to the second side 130 of speaker load 112. Conversely, when the second diagonal pair is open and the first diagonal pair is closed, current flows from the second side 130 of speaker load 112 to the first side 128 of speaker load 112.

Controller 114 controls the current through speaker load 112 with control signals generated over lines 136, 138, 140 and 142. The average load current is controlled by controlling the state of switches 120, 122, 124 and 126. For sound reproduction, controller 114 drives speaker load 112 at a predetermined switching rate. In the preferred embodiment, the switching rate is above the audible band (>20 kHz). A slower switching rate can be used, but the lower the switching rate, the more likely bothersome sound artifacts may be generated.

Controller 114 is connected to a data bus 144. Controller 114 receives linear pulse code modulated samples ("PCM samples") over the data bus 144 from a sample source (not shown), such as a storage medium of a computer system. Controller 114 generates the control signals over control lines 136, 138, 140 and 142 to drive speaker load 112 based on the content of the PCM samples thus received.

PCM samples represent sound in digital values ranging from zero to a predetermined maximum value. The predetermined maximum value is determined by the size of the PCM samples. For example, the maximum value for an eight bit PCM sample will be 256, as there are 256 states representing the combinations of the 8 binary digits.

In the preferred embodiment, controller 114 generates a pulse width modulated signal (PWM signal), a delayed PWM signal, and complementary signals of these two signals over control lines 136, 138, 140 and 142. Specifically, controller 114 generates the PWM signal over line 136 to control switch 120 and the complement of the PWM signal over line 142 to control switch 126. Preferably, switch 120 is LOW enabled and switch 126 is HIGH enabled. Since switches 120 and 126 are controlled by complementary signals, switches 120 and 126 will open and close simultaneously. Controller 114 generates the delayed PWM signal over line 138 to control switch 122 and the complement of the delayed PWM signal over line 140 to control switch 124. Switch 122 is LOW enabled and switch 124 is HIGH enabled. Consequently, similar to switches 120 and 126, switches 122 and 124 will open and close in unison.

The duration of the PWM signal pulse varies based on and in proportion to the value of each PCM sample. For example, if a PCM sample has a value of zero, the duration of the PWM signal pulse is zero, switches 120 and 126 remain open, and switches 122 and 124 remain closed. As the value of the PCM sample increases toward positive full scale, the duration of the PWM signal pulse increases toward a maximum duration equal to the sampling rate. For example, if an eight-bit PCM sample has the value of five, the duration of the PWM signal pulse will equal 5/256 times the sampling rate. Likewise, if a PCM sample has a value of 255, the duration of the PWM signal pulse complement is zero, switches 122 and 124 now remain open, and switches 120 and 126 remain closed. The duration of the PWM signal pulse determines the amount of time a positive current is flowing through speaker load 112 relative to the amount of time a negative current is flowing through speaker load 112.

Controller 114 generates the delayed PWM signal with a delay relative to the PWM signal. The delay is fixed and governed by the speed of the switching elements. This delay is to insure that one circuit through speaker load 112 is broken before another circuit through speaker load 112 is established. This strategy is commonly known as "break before make", and avoids huge current spikes that can damage the load or the switching elements. In this context, the delay ensures that switches 120 and 126 are open before switches 122 and 124 are closed, and, conversely, that switches 122 and 124 are open before switches 120 and 126 are closed. The specific mechanism for generating the PWM signal and the delayed PWM signal will be described in greater detail below with reference to FIG. 3.

Controller 114 generally includes a power manager 154 and a bus 150 which connects a bridge driver 152, a volume control circuit 156, a stereo to monophonic converter 158 and a data bus interface 160. The data bus interface 160 receives the PCM samples from data bus 144 and transmits the samples to bridge driver 152 over bus 150. Bridge driver 152 generates the PWM signal, the delayed PWM signal and their complements over lines 136, 138 140 and 142 to drive bridge unit 16 based upon the value of the PCM samples, as described above.

However, volume control circuit 156 and/or stereo to monophonic converter 158 may modify the PCM samples prior to their receipt by bridge driver 152. For example, volume control circuit 156 may analyze each PCM sample to determine the volume of the sound represented thereby, and increase or decrease the value of the PCM sample responsive to a volume setpoint. Similarly, stereo to monophonic converter 158 may be configured to analyze incoming PCM samples to determine whether the PCM samples represent stereo sound, and to convert PCM samples which represent stereo sound to PCM samples which represent monophonic sound.

Power manager 154 is connected to bridge driver 152 by a control line 162. Power manager 154 generates control signals over line 162 to control the power state of bridge driver 152. For example, power manager 154 may generate a power down signal to cause bridge driver 152 to generate control signals over lines 136, 138, 140 and 142 to open switches 120, 122, 124 and 126. In power down mode, the circuitry internal to bridge driver 152 may also enter a sleep mode to conserve power. Power manager 154 may also send an activate signal over line 162 to activate bridge driver 152.

Figure 3:
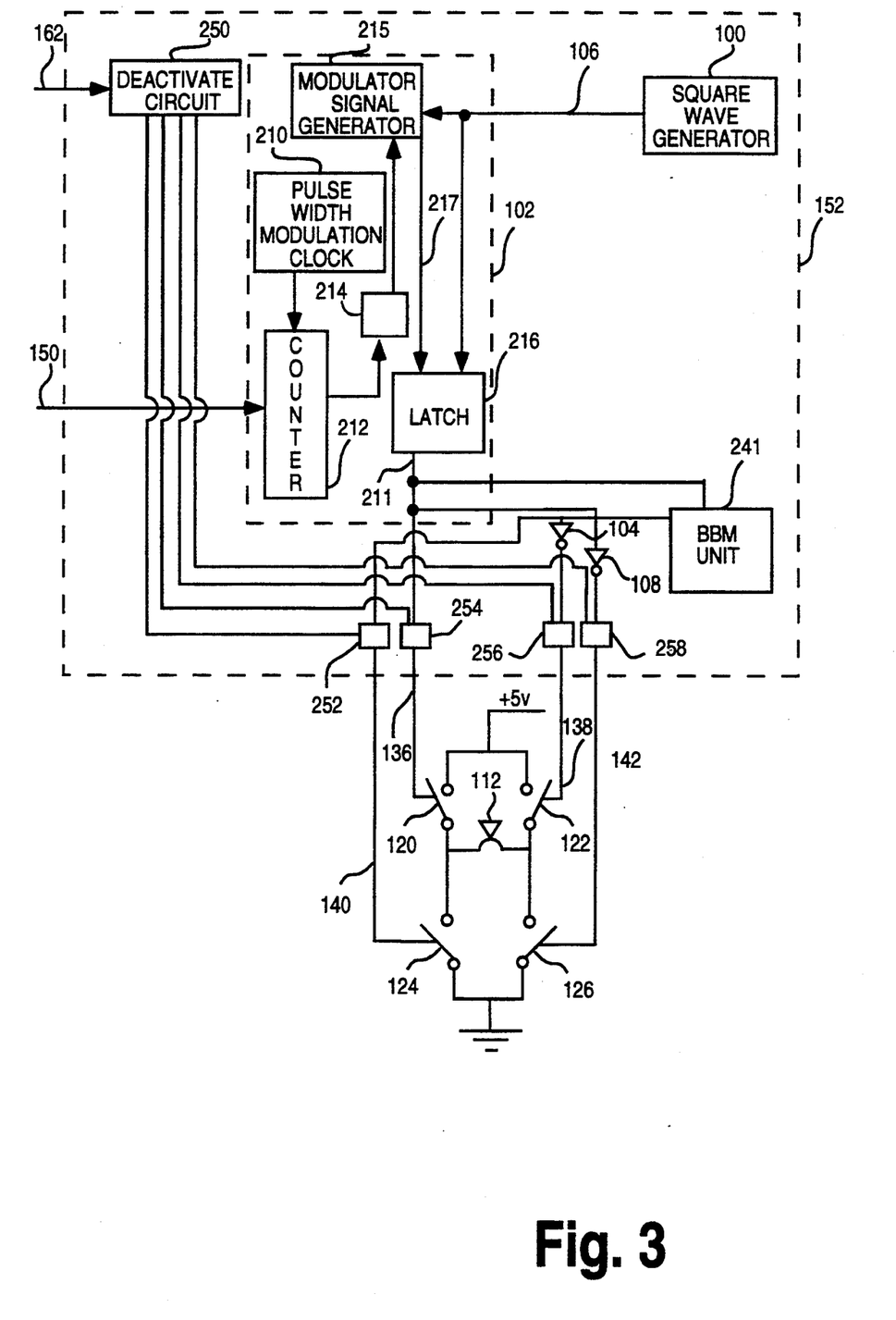
FIG. 3 is a schematic diagram of the driver of the amplifier of FIG. 2 in greater detail.

Referring now to FIG. 3, it shows bridge driver 152 of FIG. 2 in greater detail. Bridge driver 152 generally includes a square wave generator 100, a PWM generation unit 102, and a plurality of inverters 104 and 108. Square wave generator 100 generates a reference square wave signal over a line 106. The reference signal is a square wave with a duty ratio of 50% and is repeated at the sample rate (or PWM carrier frequency), typically 20-100 kHz. Line 106 is connected to PWM generation unit 102.

PWM generation unit 102 generates a PWM signal over a line 211 based on the reference square wave signal received over line 106 and the PCM samples received over line 150. The PWM signal is generated by decoding the phase difference between the reference square wave signal and a modulator square wave signal. PWM generation unit 102 generally includes a pulse width modulation clock 210, a programmable counter 212, a comparator 214, a modulator signal generator 215 and a latch 216. Latch 216 is connected to line 106, which carries the reference signal. Latch 216 is set by the rising edge of the reference signal. Latch 216 is connected to modulator signal generator 215 by a line 217. Latch 216 is cleared by the rising edge of a modulator signal received from modulator signal generator 215 over line 217.

Modulator signal generator 215 is connected to line 106. The modulator signal generated by modulator signal generator 215 over line 217 is the reference square wave signal with a delay. Specifically, the reference signal is delayed until modulator signal generator 215 receives a control signal from comparator 214 indicating an end of the delay period. The duration of the delay period is based on the value of the latest PCM sample received by counter 212. Specifically, the duration of the delay is the sample interval divided by the number of PCM states extant in the PCM data, as will now be explained.

Counter 212 is preferably a countdown timer, and is configured to receive PCM samples over line 150. Pulse width modulation clock 210 drives counter 212 at a predetermined clock rate. Preferably, the clock rate of pulse width modulation clock 210 is equal to the sample rate times the maximum PCM sample value. For example, if the PCM samples are eight bit, then the maximum value of a PCM sample is 256. For a typical personal computer with a sound sample rate of 22.5 kHz, the clock rate of the pulse width modulation clock 210 would be 256*22.5 kHz=5.76 MHz. Thus, counter 212 can be clocked 256 times within each sample interval.

Comparator 214 is configured to compare the contents of counter 212 with a predetermined value, such as zero. When the content of counter 212 is equal to or less than zero, comparator 214 generates the control signal to modulator signal generator 215 to indicate the end of the delay period. Since counter 212 is loaded with the values of PCM samples as they arrive over line 150, the contents of counter 212 will only be equal to or less than zero after pulse width modulation clock 210 has clocked counter 212 for a number of clock cycles equal to or greater than the value represented in the latest loaded PCM sample. For example, if a PCM sample corresponding to the value 10 is loaded into counter 212, counter 212 will be greater than zero until pulse width modulation clock 210 has clocked counter 212 for ten pulse width modulation clock cycles. Therefore, modulator signal generator 215 will generate a leading edge only after ten pulse width modulation clock cycles have elapsed from the time that square wave 100 generator generates a leading edge.

For the purposes of illustration, comparator 214 is shown separate from counter 212. However, comparator 214 may alternatively include one or more logic gates coupled to the borrow output (or in the case of an incrementing counter, to the carry output) of counter 212. For example, comparator 214 may include an AND gate having one input coupled to the borrow output of counter 212, and the other input coupled to pulse width modulation clock 210. Thus arranged, the output of the AND gate will change state when pulse width modulation clock 210 transmits a pulse to cause counter 212 to wrap around. Consequently, the output of the AND gate can be used as the control signal sent to modulator signal generator 215.

As is evident by the foregoing explanation, the larger the latest PCM sample, the larger the phase difference between the modulator signal and the reference signal. Since latch 216 is set and cleared based on the modulator and reference signals, the duration of the pulses on the latch output will reflect the difference between the phases in the modulator and reference signals, which in turn reflects the value of the PCM samples. The signal at the latch output (the PWM signal) is thus a varying width pulse that symmetrically spreads in duration from a minimum to a maximum.

The PWM signal is transmitted over line 211 through a switch control circuit 254 to line 136, and to line 142 through inverter 108 and a switch control circuit 258. Since switch 120 is LOW enabled and switch 126 is HIGH enabled, when the PWM signal is LOW, switches 120 and 126 are closed. Conversely, when the PWM signal is HIGH, switches 120 and 126 are open. The PWM signal is also transmitted over line 211 to break-before-make ("BBM") unit 241. BBM unit 241 imposes a delay on the PWM signal to generate a delayed PWM signal through a switch control circuit 252 to line 140, and through inverter 104 and a switch control circuit 256 to line 138. Since switch 124 is HIGH enabled and switch 122 is LOW enabled, when the delayed PWM signal is LOW, switches 124 and 122 will be open. Conversely, when the delayed PWM signal is HIGH, switches 124 and 122 will be closed. Since the delayed PWM signal is delayed relative to the PWM signal, switches 122 and 124 will not close at exactly the same instant that switches 120 and 126 open. Rather, the delay period imposed by BBM unit 241 must expire after the opening of switches 120 and 126 and before switches 122 and 124 close. This delay is important to avoid current spikes, as described above. However, the delay need not be long. A delay of 1/256ths or 2/256ths of the sample interval (typically 170–350 nanoSeconds) is usually sufficient.

Bridge driver 152 further includes a deactivate circuit 250. The deactivate circuit 250 is configured to receive control signals from power manager 154 over line 162, and to control switch control circuits 252, 254, 256 and 258. When power manager 154 sends a power-down control signal to deactivate circuit 250, deactivate circuit 250 sends control signals to switch control circuits 252, 254, 256 and 258 to cause switch control circuits 252, 254, 256 and 258 to generate signals over lines 140, 136, 138 and 142, respectively, to cause switches 124, 120, 122 and 126 to open.

Figure 4A:
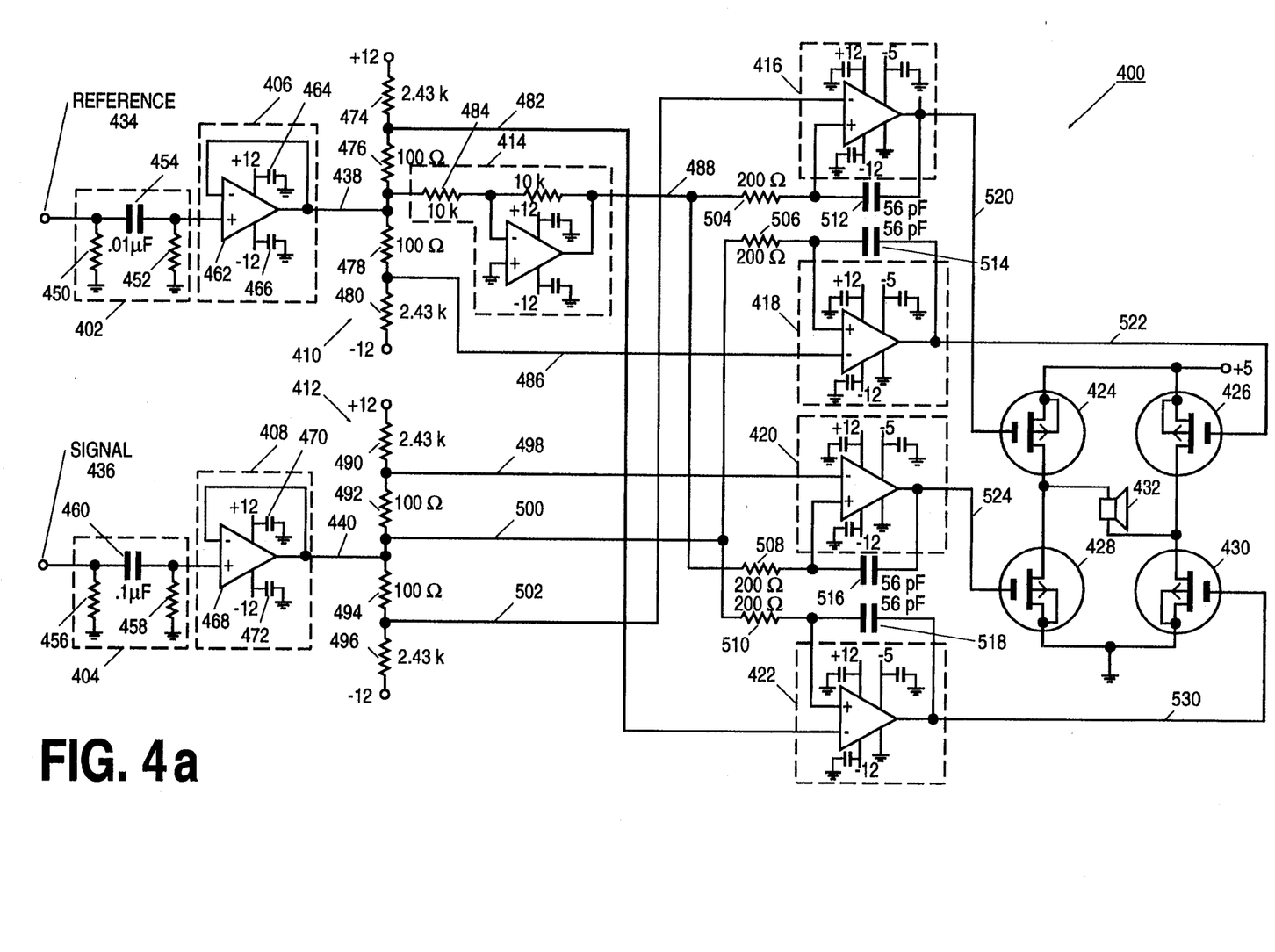
FIG. 4a is a schematic diagram of a partially analog driver according to an alternative embodiment of the invention.

FIG. 4a illustrates a partially analog PWM bridge driver 400 according to an alternative embodiment of the present invention. Bridge driver 400 generally includes a plurality of DC offset eliminators 402 and 404, a plurality of buffers 406 and 408, a plurality of voltage dividers 410 and 412, an inverter 414, a plurality of comparators 416, 418, 420 and 422, a plurality of switches 424, 426, 428, 430 and a speaker load 432.

DC offset eliminators 402 and 404 are configured to receive analog signals over a plurality of lines 434 and 436, respectively. DC offset eliminator 402 includes two resistors, 450 and 452, each of which is coupled to ground, and a capacitor 454. DC offset eliminator 404 includes a plurality of resistors 456 and 458, each of which is coupled to ground, and a capacitor 460. DC offset eliminators 402 and 404 eliminate any DC offset on the signals present on lines 434 and 436, respectively. The resulting signals are transmitted from DC offset eliminators 402 and 404 to buffers 406 and 408, respectively.

Buffer 406 includes a voltage follower 462 and a plurality of bypass capacitors 464 and 466 configured as shown. Buffer 408 includes a voltage follower 468 and a plurality of bypass capacitors 470 and 472, configured as shown. Buffers 406 and 408 receive the signals from DC offset eliminators 402 and 404, respectively, and isolate any arbitrary source impedance. Buffers 406 and 408 then output the signals onto lines 438 and 440, respectively.

The signal on line 438 is received by voltage divider 410. Voltage divider 410 includes a plurality of resistors 474, 476, 478 and 480. One end of resistor 474 is connected to +12 volts, and the other end is connected to a line 482. One end of resistor 476 is connected to line 482, and the other end is connected to line 438 and to inverter 414, which includes a resistor 484. One end of resistor 478 is connected to line 438, and to inverter 414, and the other end is connected to a line 486. One end of resistor 480 is connected to line 486, and the other end is connected to −12 volts. As configured, the signal on line 438 is transmitted over line 482 with a positive bias, is transmitted over line 486 with a negative bias, and is transmitted over line 488 after being inverted by inverter 414.

Voltage divider 412 includes a plurality of resistors 490, 492, 494 and 496 analogous to resistors 474, 476, 478 and 480 of voltage divider 410. Consequently, the signal on line 440 is transmitted over a line 498 with a positive bias, over a line 500 with no bias, and over a line 502 with a negative bias.

Each of comparators 416, 418, 420 and 422 have negative and positive inputs, and an output. The negative input of comparator 416 is connected to line 502. The positive input of comparator 416 is connected to line 488 through a resistor 504. The positive input of comparator 418 is connected to line 500 through a resistor 506. The negative input of comparator 418 is connected to line 486. The negative input of comparator 420 is connected to line 498. The positive input of comparator 420 is connected to line 488 through a resistor 508. The negative input of comparator 422 is connected to line 482, and the positive input of comparator 422 is connected to line 500 through a resistor 510. The output of comparators 416, 418, 420 and 422 are also connected to their respective positive inputs through a plurality of capacitors 512, 514, 516 and 518. These output-to-positive-input connections provide positive feedback to make the respective comparators switch more rapidly. The output of comparator 416 is connected to switch 424 by a line 520. The output of comparator 418 is connected to switch 426 by a line 522. The output of comparator 420 is connected to switch 428 by a line 424. The output of comparator 422 is connected to switch 430 by a line 530.

Switch 424 is disposed between +5 V and a first side of speaker load 432. Switch 428 is disposed between the first side of speaker load 432 and ground. Switch 426 is disposed between +5 V and a second side of speaker load 432. Switch 430 is disposed between the second side of switch 432 and ground.

Switches 424, 426, 428, and 430 are controlled by the signal on lines 520, 522, 524 and 530, respectively.

Figure 4B:
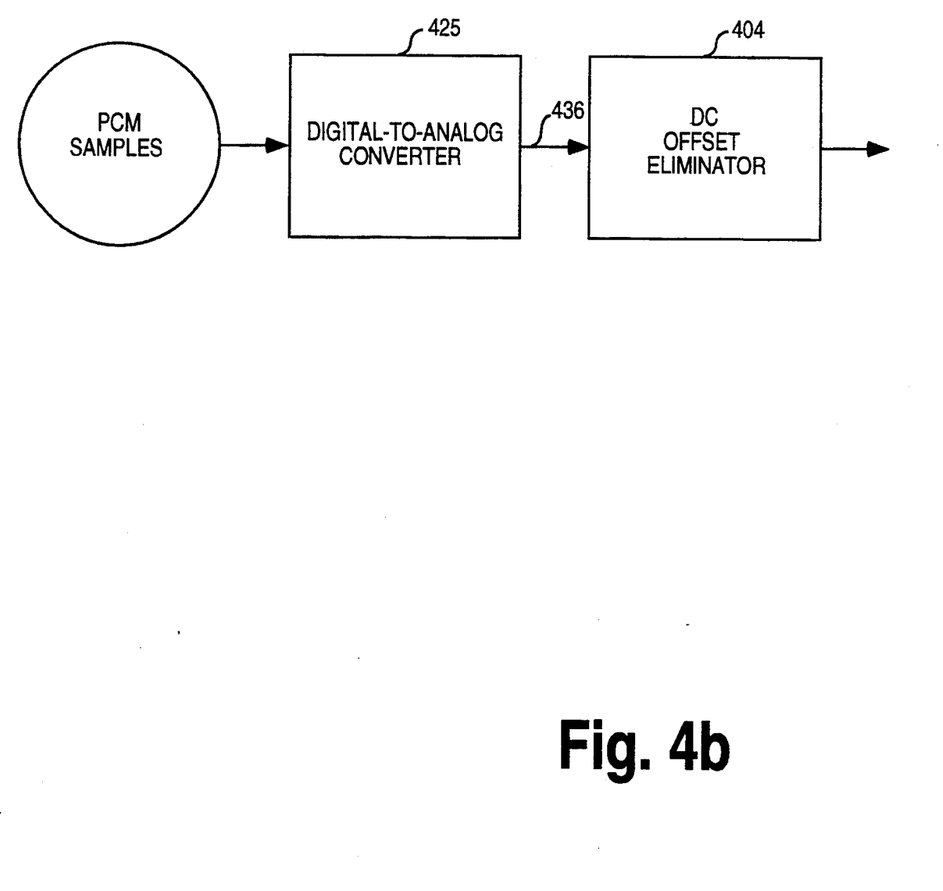
FIG. 4b is a block diagram illustrating a digital-to-analog converter configured to convert digital sound samples to an analog signal.

In the preferred embodiment, the signal on line 434 is a reference waveform, and the signal on line 436 is an analog, band-limited modulation signal generated by applying PCM samples to a digital to analog converter 425 (in FIG. 4b). PWM bridge driver 400 generates pulse width modulated signals to drive speaker load 432 by comparing the instantaneous value of the modulation signal to be encoded (the signal on line 436) with a reference waveform that sweeps through all possible amplitude levels of input (the signal on line 434). When the reference level equals the modulation signal level, the output states of comparators 416, 418, 420 and 422 change. By linearly varying the duty ratio (defined as the time "t" out of the sample interval "T" during which a signal is in a "mark" state rather than a "space" state, (t/T)), an analog of the modulation data can be encoded as pulse width data. At the end of each sample interval, the reference waveform is repeated and the comparison operation begins again.

To implement this operation, a reference waveform with a ramp wave shape may be used. A ramp wave shape may be produced by linearly increasing the reference signal from a minimum voltage ("−Vmin") to a maximum voltage ("+Vmax") and then rapidly returning to −Vmin.

While the ramp wave shape is useful for carrier rates which are much greater than the signal band width, the use of a ramp wave shape can produce an unacceptable distortion when the carrier frequency approaches, in the limit, the upper band edge of the modulation signal band. Specifically, with a ramp waveform, the PWM can be thought of as a manipulation of the carrier such that one edge remains fixed while the other is varied to include the modulation. Generated this way, the center of mass (the first moment) of each varying width carrier pulse will shift as a function of modulation, generating a kind of intermodulation distortion. This distortion is counter-acted by defining the PWM process as one which keeps the center of mass of the varying width pulse constant as the modulation level varies. Consequently, when the reference signal equals −Vmin, a very narrow pulse is generated, and as the signal approaches (|−Vmin|++Vmax)/2, the PWM has a 50% duty ratio centered around the same epoch caused by −Vmin. In the preferred embodiment, this is accomplished by using a triangular wave shape rather than a ramp wave shape for the reference waveform. The triangular wave decreases linearly from +Vmax to −Vmin, and then its slope changes sign from −1 to +1, and the triangle increases from −Vmin to +Vmax.

Comparators 416, 418, 420 and 422 generate control signals at their respective outputs based on a comparison of the reference waveform with the modulation signal. When the level of the modulation signal is greater than the reference waveform, switches 424 and 430 are closed, causing a positive current flow through speaker load 432. When the modulation signal level is below the level of the reference waveform, switches 426 and 428 are closed, resulting in a negative current flow through speaker load 432. Thus, the duty ratio of the carrier pulse through speaker load 432 is varied in response to the comparisons performed by comparators 416, 418, 420 and 422. The signals applied to the inputs of comparators 416, 418, 420 and 422 are biased from the original reference and modulation signals, as described above, to ensure that the circuit formed through speaker load 432 by one diagonal pair of switches is broken before the circuit through speaker load 432 by the other diagonal pair of switches is made.

As described in detail above, both driver 110 and driver 400 provide efficient, open-loop circuits for converting PCM samples to pulse width modulated control signals to drive speaker loads. Further, driver 110 is fully implemented using digital technology. Since the disclosed driver scheme lends itself to digital implementation, numerous disadvantages associated with prior art analog implementations can be avoided. For example, the performance of a fully digital bridge driver is not as sensitive to component tolerances, or component tolerance deviations, as are analog amplifiers. Further, the quality of sound produced by a digital amplifier will not be substantially affected by slight fluctuations in the power supply voltage. Further, since the sound information is digitally processed, its intelligibility may be enhanced through digital manipulation techniques not generally available in analog systems.

One way to increase the intelligibility of sound is to reduce the dynamic range of the sound. Specifically, rather than have the sound data excurse over a wide dynamic range, and consequently have soft and loud portions, the sound data can be modified so that the sound represented by the data is generated at a substantially constant volume. Dynamic range reduction can be performed in a variety of ways, either prior to or during playback.

Typically, a pulse width modulated signal is produced by comparing a modulation signal with a reference signal. The pulse width modulated signal resulting from this comparison is used to drive a speaker to produce the sound encoded in the modulation signal. The pulse width modulated signal, and consequently the sound produced in response to the pulse width modulated signal, will change if either the modulation signal or the reference signal is altered before the comparison operation.

Figure 5:
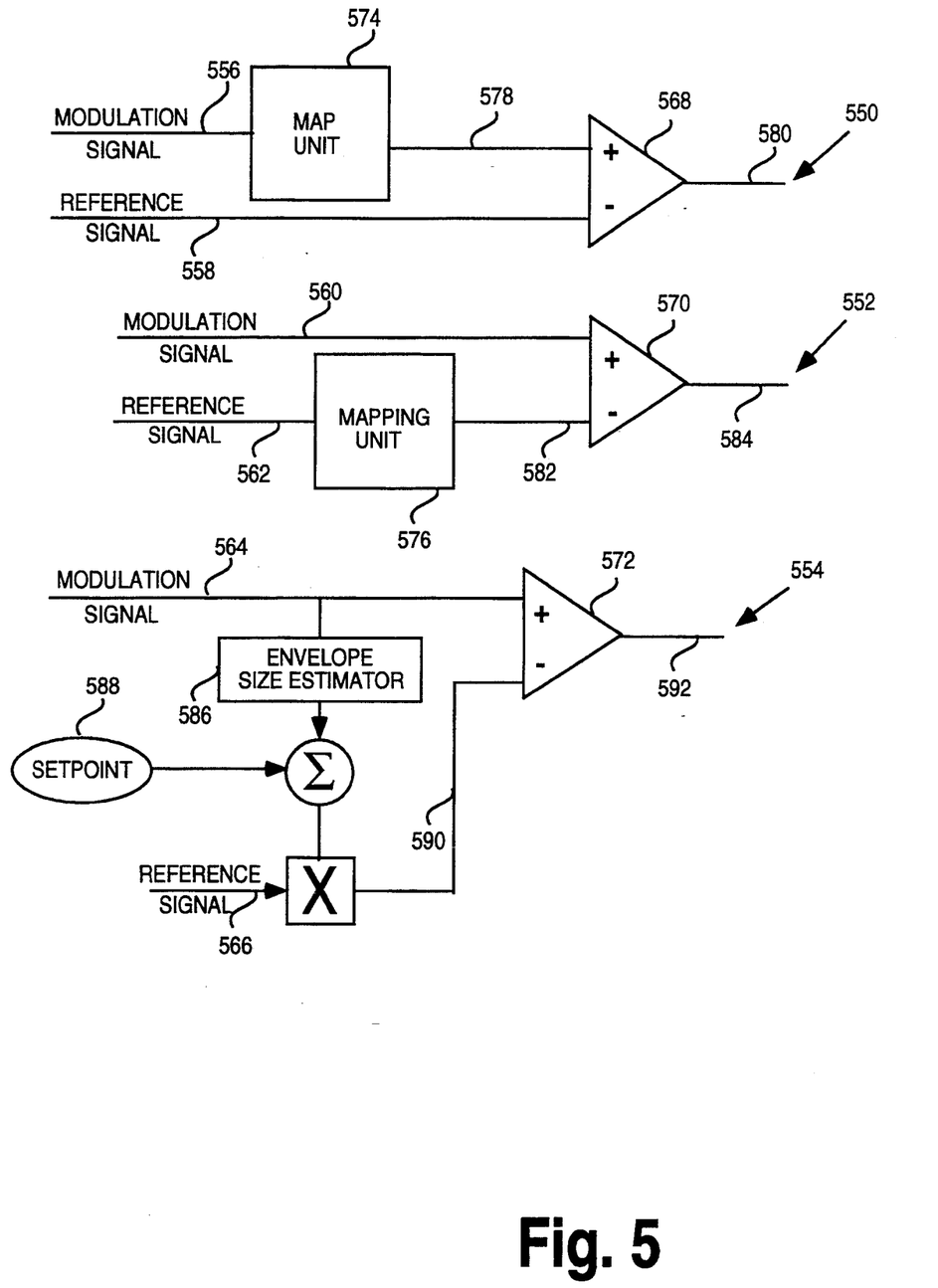
FIG. 5 is a schematic diagram illustrating circuits for reducing the dynamic range of sound represented in a modulation signal.

Referring now to FIG. 5, three circuits 550, 552 and 554 for compressing the dynamic range of the sound represented in a modulation signal are illustrated. Circuit 550 includes a line 556 for receiving a modulation signal, a line 558 for receiving a reference signal, and a comparator 568. The modulation signal is a signal encoding sound. The modulation and reference signals may be either analog or digital. Similar to circuit 550, circuit 552 includes a line 560 for receiving a modulation signal, a line 562 for receiving a reference signal and a comparator 570, and circuit 554 includes a line 564 for receiving a modulation signal, a line 566 for receiving a reference signal, and a comparator 572.

In each of circuits 550, 552 and 554, either the modulation signal or the reference signal is processed before it is compared to the other signal. As a result of the prior signal processing, the comparison operation will produce a pulse width modulated signal to drive a speaker to produce the sound encoded in the modulation signal with a reduced dynamic range (a "compressed PWM signal"). Specifically, in circuit 550, the modulation signal on line 556 is applied to a mapping unit 574 to produce a modified modulation signal on a line 578. The modified modulation signal and the reference signal are applied to comparator 568, which compares the modified modulation signal and the reference signal and produces a compressed PWM signal on a line 580 based on the comparison.

Mapping unit 574 implements a function having a saturating characteristic and no singularities ("a smooth saturating function"). Suitable functions include the CCITT A-law or μ-law, or any function that is linear around zero but approaches plus or minus one asymptotically. Such functions include the tanh function, or the sigmoid function.

In the case of a digital modulation signal, mapping unit 574 may implement the mapping function by either a lookup table or a processor programmed to perform the function. For real-time playback applications, a lookup table embodiment may be preferred, since the performance of the calculations necessary to perform the function may introduce unacceptable delays. In the case of an analog modulation signal, mapping unit 574 may implement the mapping function by applying the modulation signal to an analog circuit configured to implement the mapping function (i.e. an "analog computer").

Circuit 552 is similar to circuit 550 except that the reference signal rather than the modulation signal is pre-processed by a mapping unit 576. Mapping unit 576 may be implemented in the same manner as described above with reference to mapping unit 574. Mapping unit 576 maps the reference signal on line 562 to produce a modified reference signal on a line 582. The modified reference signal and the modulation signal are applied to comparator 570 to produce a compressed PWM signal on a line 584.

Circuit 554 is similar to circuit 552 in that comparator 572 compares the modulation signal with a pre-processed reference signal. However, the reference signal on line 566 is processed based on the envelope size of the modulation signal on line 564, rather than according to a smooth saturating function. Specifically, an envelope size estimator 586 estimates the envelope size of the modulation signal on line 564 based on the amplitude of the modulation signal. Envelope estimator 586 may include, for example, a precision half wave rectifier and a smoothing filter (not shown). Responsive to the amplitude of the modulation signal, the envelope estimator 586 transmits an envelope size signal. The envelope size signal is summed with a setpoint signal 588 to ensure that the envelope size signal is non-zero. The reference signal on line 566 is multiplied by the envelope size signal to generate a modified reference signal on a line 590. As a result, if the amplitude of the modulation signal is high, the amplitude of the reference signal will be increased to produce the modified reference signal. Conversely, if the amplitude of the modulation signal is low, the amplitude of the reference signal will be decreased to produce the modified reference signal. Comparator 572 compares the modulation signal on line 564 to the modified reference signal on line 590 to produce a compressed PWM signal on a line 592.

Figure 6:
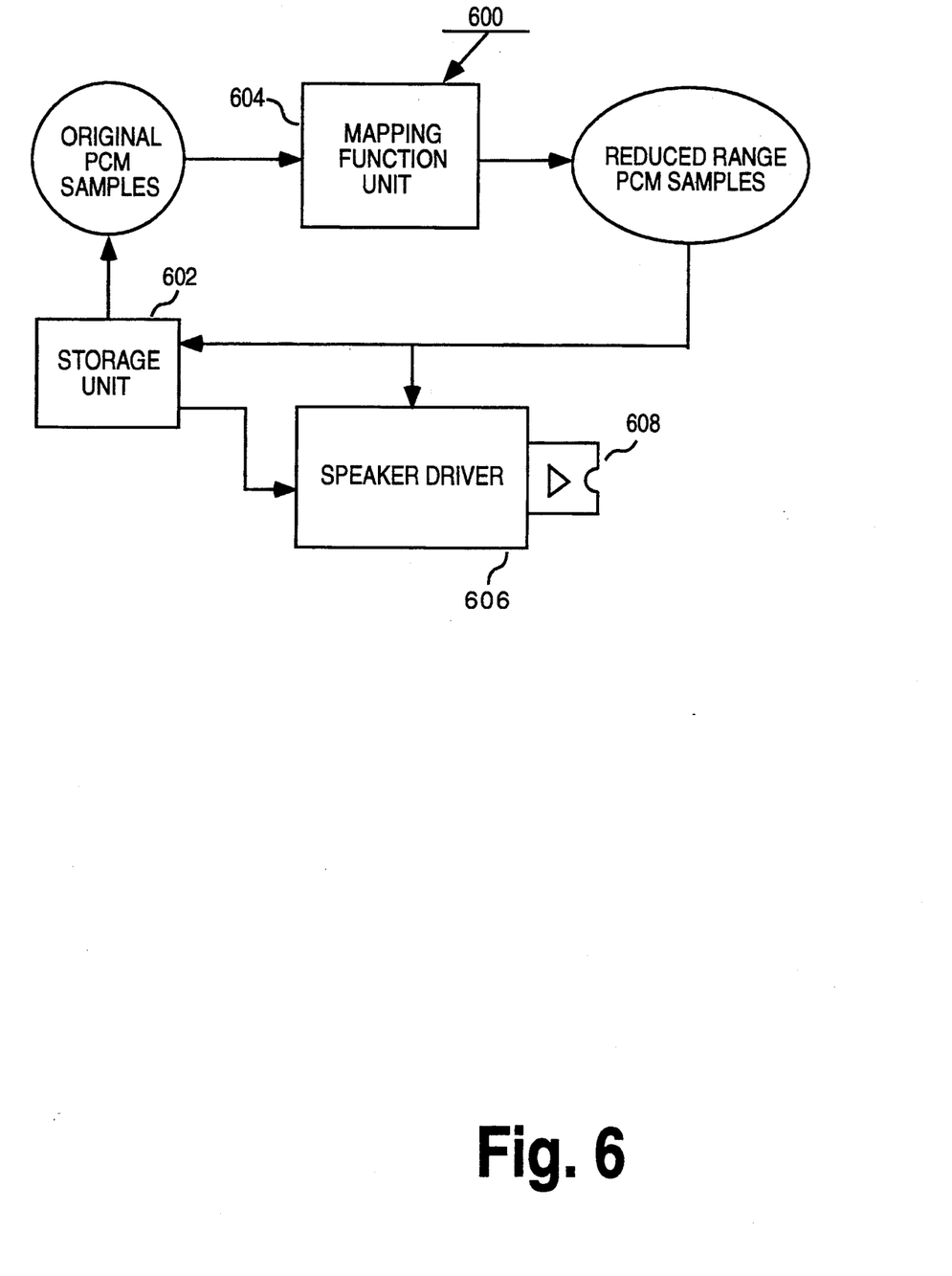
FIG. 6 is a block diagram illustrating a speaker system with a digital dynamic range reduction subsystem.

Referring now to FIG. 6, it shows a block diagram of a speaker system 600 with dynamic range control according to one embodiment of the invention. System 600 illustrates a specific implementation of circuit 550 described above. System 600 includes a storage unit 602, a mapping function unit 604, a bridge driver 606 and a speaker load 608. Bridge driver 606 may be, for example, driver 152 or driver 400.

Storage unit 602 may be, for example, a disk drive on a computer system. Storage unit 602 is configured to store a plurality of original PCM samples. The original PCM samples represent sound information as it was sampled at its original volume levels. Therefore, the PCM samples constitute a digital modulation signal.

Mapping function unit 604 is connected to storage unit 602 and retrieves from storage unit 602 the original PCM samples. Mapping function unit 604 generates reduced range PCM samples based on the values of the original PCM samples. The reduced range PCM samples may then be transmitted back to storage unit 602 and stored for future playback, or sent directly to bridge driver 606 for playback in real time.

Mapping function unit 604 generates the reduced range PCM samples by mapping the original PCM samples to PCM values representative of sound within a predetermined dynamic range according to a smooth saturating function. Mapping function unit 604 may perform the mapping by use of either a lookup table, a processor programmed to perform the mapping function, or an analog computer. If an analog computer is used to implement the mapping function, the digital signal represented by the PCM values is first converted to produce an analog modulation signal. The analog modulation signal is then applied to an analog circuit configured to perform the mapping function.

Speaker driver 606 receives the reduced range PCM samples and compares the reduced range PCM samples with a reference signal to produce a compressed PWM signal, as described above. The reduced range PCM samples may be compared with values representative of a digital reference signal, or converted to analog and compared to an analog reference signal. Speaker driver 606 drives speaker load 608 based on the compressed PWM signal.

Figure 7:
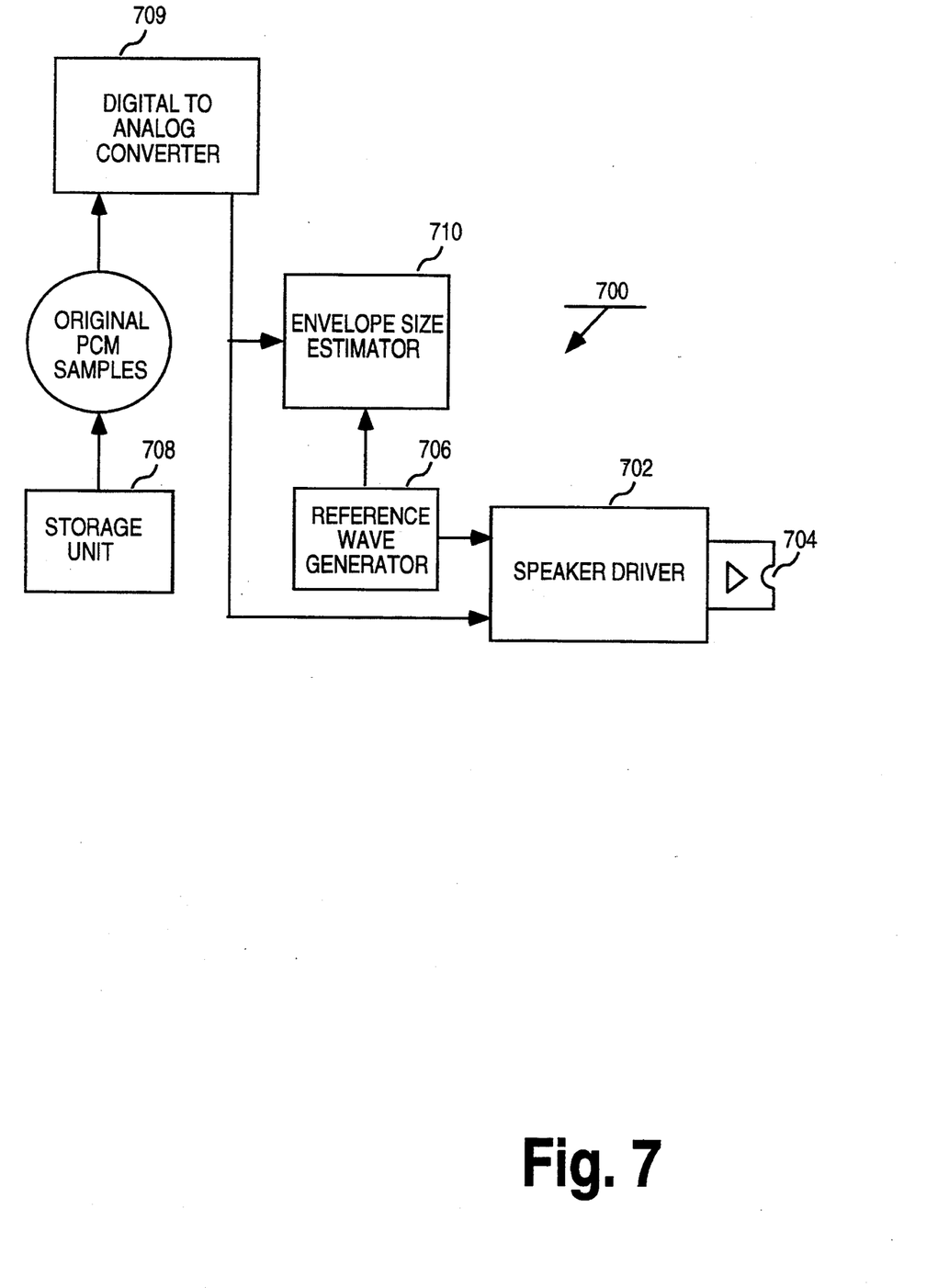
FIG. 7 is a block diagram illustrating a speaker system with an analog dynamic range reduction subsystem.

FIG. 7 illustrates a system 700 implementing an alternative process to reduce the dynamic range of sound during playback. The dynamic range reduction process used by system 700 is an implementation of the method generally described above with respect to circuit 554. System 700 includes a bridge driver 702 configured to drive a speaker load 704 based on a reference waveform generated by a reference wave generator 706 and a modulation signal generated by a digital to analog converter 709 based on original PCM data. The original PCM data is retrieved from a storage unit 708, such as a disk drive. However, reference wave generator 706 does not simply generate a uniform triangular wave as discussed above. Rather, the wave generated by reference wave generator 706 is generated by adjusting the amplitude of a triangular wave in response to the estimated size of the PCM data envelope plus a predetermined setpoint value. Reference wave generator 706 receives PCM data envelope estimates from an envelope size estimator 710.

Envelope size estimator 710 receives the modulation signal from the digital to analog converter 709 and estimates the envelope size of the data based on the amplitude of the modulation signal. Envelope size estimator 710 may include, for example, a precision half wave rectifier and a smoothing filter (not shown). The envelope size estimator 710 transmits a signal indicative of envelope size estimates to reference wave generator 706 while the modulation signal upon which the estimate is based is sent to bridge driver 702. Reference wave generator 706 generates a waveform with an amplitude responsive to the estimated envelope size. The larger the amplitude of the modulation signal, the larger the estimated sample envelope, and the larger the amplitude of the reference waveform with which the modulation signal will be compared. Preferably, reference wave generator 706 adds a predetermined setpoint to the reference signal to ensure that the reference waveform will have a non-zero amplitude.

By increasing the amplitude of the reference waveform in response to an increase in the amplitude of the PCM-based waveform, the duty ratio of speaker 704 will be reduced from what it would otherwise have been if the amplitude of the reference waveform had not been increased. Conversely, by reducing the amplitude of the reference waveform in a response to small envelope size estimates, the duty ratio of speaker load 704 will be greater than it otherwise would have been if the amplitude of the waveform had not been decreased. As a result, the volume of sounds reproduced in response to PCM samples representing louder sounds will be reduced, and the volume of sounds produced in response to PCM samples representing softer sounds will be increased.

While specific embodiments of the present invention have been described, various modifications and substitutions will become apparent to one skilled in the art by this disclosure. Such modifications and substitutions are within the scope of the present invention, and are intended to be covered by the following claims.

What is claimed is:

1. An open-loop amplifier for driving a speaker in a computer system, the open-loop amplifier comprising:
   a plurality of switches including a first set of switches and a second set of switches, the first set of switches being connected to the speaker and to a power source, the first set of switches being configured to provide a positive current flow through the speaker when the first set of switches is activated, the second set of switches being connected to the speaker and the power source, the second set of switches being configured to provide a negative current flow through the speaker when the second set of switches is activated;
   a bridge driver operatively connected with the plurality of switches, the bridge driver being configured to receive a plurality of pulse code modulated samples representative of sound sampled at a sampling rate, and to activate and deactivate the plurality of switches in response to the plurality of pulse code modulated samples;
   wherein the bridge driver includes:
      a pulse width modulation generation unit configured to receive a square wave signal and the plurality of pulse code modulated samples and to generate a pulse width modulated signal based on the square wave signal and the plurality of pulse code modulated samples; and
      a break-before-make unit connected with the pulse width modulation generation unit, the break-before-make unit receiving the pulse width modulated signal from the pulse width modulation generation unit and generating a delayed pulse width modulated signal, the delayed pulse width modulated signal being the pulse width modulated signal with a predetermined delay;
      the first set of switches being deactivated based upon the pulse width modulated signal to cause the positive current flow through the speaker to cease prior to the second set of switches being activated based upon the delayed pulse width modulated signal to cause the negative current flow through the speaker to begin.

2. The open-loop amplifier of claim 1 wherein the bridge driver further includes a square wave generator connected to the pulse width modulation generation unit, the square wave generator generating the square wave signal and transmitting the square wave signal to the pulse width modulation generation unit.

3. An open-loop amplifier for driving a speaker in a computer system, the open-loop amplifier comprising:
   a plurality of switches including a first set of switches and a second set of switches, the first set of switches being connected to the speaker and to a power source, the first set of switches being configured to provide a positive current flow through the speaker when the first set of switches is activated, the second set of switches being connected to the speaker and the power source, the second set of switches being configured to provide a negative current flow through the speaker when the second set of switches is activated;
   a bridge driver operatively connected with the plurality of switches, the bridge driver being configured to receive a plurality of pulse code modulated samples representative of sound sampled at a sampling rate, and to activate and deactivate the plurality of switches in response to the plurality of pulse code modulated samples;
   wherein the bridge driver includes a pulse width modulation generation unit configured to receive a square wave signal and the plurality of pulse code modulated samples and to generate a pulse width modulated signal based on the square wave signal and the plurality of pulse code modulated samples;
   wherein the pulse width modulation generation unit includes:
      a programmable counter for receiving the plurality of pulse code modulated samples, for storing a most recently received pulse code modulated sample, and for modifying by a predetermined fixed amount the most recently received pulse code modulated sample in response to pulses of a pulse width modulation clock signal;
      a comparator connected to the programmable counter for comparing the most recently received pulse code modulated sample to a predetermined value, the comparator generating an indicator signal indicative of when the most recently received pulse code modulated sample has a predetermined relationship relative to the predetermined value;
      a modulator signal generator connected to the comparator, the modulator signal generator receiving the indicator signal and the square wave signal, the modulator signal generator generating a modulator signal responsive to the square wave signal and the indicator signal, the modulator signal being the square wave signal delayed for a duration responsive to the indicator signal;
      a latch connected to the modulator signal generator, the latch receiving the modulator signal and the square wave signal and generating the pulse width modulated signal responsive to the modulator signal and the square wave signal.

4. The open-loop amplifier of claim 3 wherein the pulse width modulation generation unit further includes a pulse width modulation clock connected with the programmable counter, the pulse width modulation clock generating the pulse width modulation clock signal and transmitting the pulse width modulation clock signal to the programmable counter.

5. The open-loop amplifier of claim 4 wherein the pulse width modulation clock generates the pulse width modulation clock signal at a rate equal to the sampling rate divided by a maximum value representable by any given pulse code modulated sample of the plurality of pulse code modulated samples.

6. The open-loop amplifier of claim 3 wherein the latch has a clear input, a preset input, and an output, the clear input being connected to the modulator signal generator for receiving the modulator signal, the preset input receiving the square wave signal, the latch generating the pulse width modulated signal at its output responsive to the modulator signal and the square wave signal.

7. The open-loop amplifier of claim 3 wherein the programmable counter decrements the most recently received pulse code modulated sample in response to a pulse width modulation clock signal.

8. The open-loop amplifier of claim 3 wherein the programmable counter increments the most recently received pulse code modulated sample in response to a pulse width modulation clock signal.

9. An open-loop amplifier for driving a speaker in a computer system, the open-loop amplifier comprising:
 a plurality of switches including a first set of switches and a second set of switches, the first set of switches being connected to the speaker and to a power source, the first set of switches being configured to provide a positive current flow through the speaker when the first set of switches is activated, the second set of switches being connected to the speaker and the power source, the second set of switches being configured to provide a negative current flow through the speaker when the second set of switches is activated;
 a bridge driver operatively connected with the plurality of switches, the bridge driver being configured to receive a plurality of pulse code modulated samples representative of sound sampled at a sampling rate, and to activate and deactivate the plurality of switches in response to the plurality of pulse code modulated samples;
 wherein the bridge driver includes:
  a digital-to-analog converter, the digital-to-analog converter receiving said plurality of pulse code modulated samples and converting the plurality of pulse code modulated samples to an analog sound signal; and
  comparing means for performing a comparison of the analog sound signal to a reference signal, the bridge driver activating and deactivating the plurality of switches in response to the comparison.

10. The open-loop amplifier of claim 9 wherein the reference signal is a triangular wave signal.

11. The open-loop amplifier of claim 9 wherein the bridge driver further includes:
 a first voltage splitter for receiving the reference signal and for generating a positively biased reference signal and a negatively biased reference signal;
 a second voltage splitter connected to the digital-to-analog converter for receiving the analog sound signal and generating a positively biased sound signal and a negatively biased sound signal; and
 an inverter for receiving the reference signal and for generating an inverted reference signal.

12. The open-loop amplifier of claim 11 wherein the comparing means comprises a plurality of comparators, including a first, second, third and fourth comparators, the first comparator receiving the negatively biased sound signal and the inverted reference signal to generate a first control signal, the second comparator receiving the negatively biased reference signal and the analog sound signal to produce a second control signal, the third comparator receiving the positively biased sound signal and the inverted reference signal to produce a third control signal, and the fourth comparator receiving the positively biased reference signal and the analog sound signal to produce a fourth control signal.

13. The open-loop amplifier of claim 12 wherein the first set of switches are activated in response to the first control signal and the fourth control signal, the second set of switches being activated in response to the second control signal and the third control signal.

14. A method for driving a speaker in a computer system, the method comprising the steps of:
 providing a positive current flow through a speaker when a first set of switches of a plurality of switches is activated,
 providing a negative current flow through the speaker when a second set of switches of said plurality of switches is activated;
 causing a bridge driver operatively connected with the plurality of switches to receive a plurality of pulse code modulated samples representative of sound sampled at a sampling rate, and
 causing said bridge driver to activate and deactivate the plurality of switches in response to the plurality of pulse code modulated samples
 wherein said bridge driver includes a break-before-make unit and a pulse width modulation generation unit,
 the step of causing said bridge driver to receive said plurality of pulse code modulated samples including the step of causing the pulse width modulation generation unit to receive the plurality of pulse code modulated samples;
 the step of causing said bridge driver to activate and deactivate the plurality of switches in response to the plurality of pulse code modulated samples including the steps of:
 causing the pulse width modulation generation unit to receive a square wave signal;
 causing said pulse width modulation generation unit to generate a pulse width modulated signal based on the square wave signal and the plurality of pulse code modulated samples;
 causing the break-before-make unit to receive the pulse width modulated signal from the pulse width modulation generation unit;
 causing said break-before-make unit to generate a delayed pulse width modulated signal, the delayed pulse width modulated signal being the pulse width modulated signal with a predetermined delay;
 causing said bridge driver to deactivate the first set of switches based upon the pulse width modulated signal to cause the positive current flow through the speaker to cease prior to activating the second set of switches, and
 causing said bridge driver to activate the second set of switches based upon the delayed pulse width modulated signal to begin the negative current flow through the speaker after the first set of switches have been deactivated.

15. A method for driving a speaker in a computer system, the method comprising the steps of:

providing a positive current flow through a speaker when a first set of switches of a plurality of switches is activated, providing a negative current flow through the speaker when a second set of switches of said plurality of switches is activated;

causing a bridge driver operatively connected with the plurality of switches to receive a plurality of pulse code modulated samples representative of sound sampled at a sampling rate, and causing said bridge driver to activate and deactivate the plurality of switches in response to the plurality of pulse code modulated samples;

wherein said bridge driver includes a pulse width modulation generation unit;

the step of causing said bridge driver to activate and deactivate the plurality of switches in response to the plurality of pulse code modulated samples including the steps of:

causing the pulse width modulation generation unit to receive a square wave signal;

causing said pulse width modulation generation unit to generate a pulse width modulated signal based on the square wave signal and the plurality of pulse code modulated samples;

wherein said pulse width modulation generation unit includes a programmable counter, a modulator signal generator, a latch, and a comparator, the step of causing the pulse width modulation generation unit to receive the plurality of pulse code modulated samples including the step of causing said programmable counter to receive the plurality of pulse code modulated samples, said step of causing said pulse width modulation generation unit to generate a pulse width modulated signal based on the square wave signal and the plurality of pulse code modulated samples including the steps of:

causing said programmable counter to store a most recently received pulse code modulated sample;

causing said programmable counter to modify by a predetermined fixed amount the most recently received pulse code modulated sample in response to pulses of a pulse width modulation clock signal;

causing said comparator to compare the most recently received pulse code modulated sample to a predetermined value;

causing the comparator to generate an indicator signal indicative of when the most recently received pulse code modulated sample has a predetermined relationship relative to the predetermined value;

causing the modulator signal generator to receive the indicator signal and the square wave signal;

causing the modulator signal generator to generate a modulator signal responsive to the square wave signal and the indicator signal, the modulator signal being the square wave signal delayed for a duration responsive to the indicator signal;

causing a set input on the latch to receive the modulator signal;

causing a preset input on the latch to receive the square wave signal; and causing the latch to generate the pulse width modulated signal at its output responsive to the modulator signal and the square wave signal.

16. The method of claim 15 wherein the pulse width modulation generation unit further includes a pulse width modulation clock connected with the programmable counter, the step of causing said programmable counter to modify by a predetermined fixed amount the most recently received pulse code modulated sample in response to a pulse width modulation clock signal including the steps of:

causing the pulse width modulation clock to generate the pulse width modulation clock signal, causing the pulse width modulation clock to transmit the pulse width modulation clock signal to the programmable counter.

17. A method for driving a speaker in a computer system, the method comprising the steps of:

providing a positive current flow through a speaker when a first set of switches of a plurality of switches is activated, providing a negative current flow through the speaker when a second set of switches of said plurality of switches is activated;

causing a bridge driver operatively connected with the plurality of switches to receive a plurality of pulse code modulated samples representative of sound sampled at a sampling rate, and causing said bridge driver to activate and deactivate the plurality of switches in response to the plurality of pulse code modulated samples;

wherein the bridge driver includes a digital-to-analog converter, the step of causing a bridge driver to receive a plurality of pulse code modulated samples comprising the steps of:

causing the digital-to-analog converter to receive said plurality of pulse code modulated samples;

causing the digital-to-analog converter to convert the plurality of pulse code modulated samples to an analog sound signal;

causing the digital-to-analog converter to transmit said analog sound signal to said bridge driver;

the step of causing said bridge driver to activate and deactivate the plurality of switches including the steps of:

performing a comparison between the analog sound signal to a reference signal;

causing the bridge driver to activate and deactivate the plurality of switches in response to the comparison.

18. The method of claim 17 wherein the step of performing a comparison between the analog sound signal and a reference signal includes the step of performing a comparison between the analog sound signal and a triangular wave signal.

19. The method of claim 17 wherein the step of causing the bridge driver to activate and deactivate the plurality of switches in response to the comparison includes the steps of:

generating a positively biased reference signal and a negatively biased reference signal;

generating a positively biased sound signal and a negatively biased sound signal;

generating an inverted reference signal;

generating a first control signal based on the negatively biased sound signal and the inverted reference signal;

generating a second control signal based on the negatively biased reference signal and the analog sound signal;

generating a third control signal based on the positively biased sound signal and the inverted reference signal; and generating a fourth control signal based on the positively biased reference signal and the analog sound signal;

causing said bridge driver to activate the first set of switches in response to the first control signal and the fourth control signal; and causing said bridge driver to activate the second set of switches in response to the second control signal and the third control signal.

* * * * *